(12) United States Patent
Jeon

(10) Patent No.: US 9,508,403 B2
(45) Date of Patent: Nov. 29, 2016

(54) SEMICONDUCTOR DEVICE

(71) Applicant: SK hynix Inc., Icheon-si Gyeonggi-do (KR)

(72) Inventor: Byung Deuk Jeon, Seongnam-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/719,571

(22) Filed: May 22, 2015

(65) Prior Publication Data

US 2016/0217837 A1    Jul. 28, 2016

(30) Foreign Application Priority Data

Jan. 26, 2015  (KR) ........................ 10-2015-0011874

(51) Int. Cl.
  *G11C 7/10*    (2006.01)
  *G11C 7/22*    (2006.01)
  *G11C 7/12*    (2006.01)
(52) U.S. Cl.
  CPC .............. *G11C 7/1057* (2013.01); *G11C 7/106* (2013.01); *G11C 7/1039* (2013.01); *G11C 7/1066* (2013.01); *G11C 7/1069* (2013.01); *G11C 7/12* (2013.01); *G11C 7/222* (2013.01); *G11C 2207/105* (2013.01)
(58) Field of Classification Search
  CPC ......... G11C 7/106; G11C 7/12; G11C 7/222; G11C 7/1057
  USPC ................................................... 365/189.05
  See application file for complete search history.

(56) References Cited

U.S. PATENT DOCUMENTS

| | | | | |
|---|---|---|---|---|
| 7,626,873 | B2 * | 12/2009 | Ku ........................ | G11C 7/1051 |
| | | | | 365/189.05 |
| 7,800,957 | B2 * | 9/2010 | Na ........................ | G11C 7/1051 |
| | | | | 365/189.05 |
| 7,826,303 | B2 * | 11/2010 | Ko ........................ | G11C 7/1039 |
| | | | | 365/189.05 |
| 9,263,101 | B2 * | 2/2016 | Kim ........................ | G11C 7/10 |
| 2008/0278208 | A1 * | 11/2008 | Jung ........................ | H03K 5/12 |
| | | | | 327/170 |
| 2014/0021978 | A1 | 1/2014 | Ikeda | |

FOREIGN PATENT DOCUMENTS

KR    1020120119532 A    10/2012

* cited by examiner

*Primary Examiner* — Pho M Luu
(74) *Attorney, Agent, or Firm* — William Park & Associates Ltd.

(57) ABSTRACT

A semiconductor device may include a first channel configured to output a first rising clock, a first falling clock, first rising data, and first falling data. The semiconductor device may include a second channel configured to output a second rising clock, a second falling clock, second rising data, and second falling data. The semiconductor device may include an I/O control unit configured to receive the first rising clock, the first falling clock, the first rising data, and the first falling data, generate output data, and externally output the output data through a pad unit or receive the second rising clock, the second falling clock, the second rising data, and the second falling data, generate the output data, and externally output the output data through the pad unit.

38 Claims, 9 Drawing Sheets

SEMICONDUCTOR DEVICE

CROSS-REFERENCE TO RELATED APPLICATION

The present application claims priority under 35 U.S.C. §119(a) to Korean application number 10-2015-0011874, filed on Jan. 26, 2015, in the Korean Intellectual Property Office, which is incorporated herein by reference in its entirety.

BACKGROUND

1. Technical Field

Various embodiments generally relate to a semiconductor device, and more particularly, to a semiconductor device and data output.

2. Related Art

In recent years, a semiconductor device continues to require a high bandwidth to improve performance of the semiconductor device. A high bandwidth can be supported by extending the number of Input/Output (I/O) lines of a semiconductor device. A semiconductor device having the number of I/O lines extended as described above is called a multi-channel wide I/O semiconductor device. Furthermore, a multi-channel wide I/O semiconductor device may include a plurality of memory unit blocks. The plurality of memory unit blocks may independently operate without mutual interference. In this case, each of the memory unit blocks is called a channel.

Meanwhile, bump pads are used to supply various internal signal and power voltages between a plurality of semiconductor devices stacked in an integrated circuit. For high-speed operation and high integration, the bump pads are designed to have diameters of several tens of micrometers (μm) in size.

Bump pads of several tens of micrometers (μm) in size are very small. These bump pads are so small they cannot be probed by test equipment using a probe pin. Accordingly, common semiconductor devices are tested using a separate probe pad having a greater size than the bump pad.

SUMMARY

In an embodiment, there may be provided a semiconductor device. The semiconductor device may include a first channel configured to output a first rising clock, a first falling clock, first rising data, and first falling data. The semiconductor device may include a second channel configured to output a second rising clock, a second falling clock, second rising data, and second falling data. The semiconductor device may include an I/O control unit configured to receive the first rising clock, the first falling clock, the first rising data, and the first falling data, generate output data, and externally output the output data through a pad unit, or may receive the second rising clock, the second falling clock, the second rising data, and the second falling data, generate the output data, and externally output the output data through the pad unit.

In an embodiment, there may be provided a semiconductor device. The semiconductor device may include an I/O control unit configured to receive first rising data, first falling data, a first rising clock, and a first falling clock from a first channel and generate output data, or may receive second rising data, second falling data, a second rising clock, and a second falling clock from a second channel and generate the output data. The semiconductor device may include a pad unit configured to externally output the output data.

In an embodiment, there may be provided a semiconductor device. The semiconductor device may include an I/O control unit configured to receive a first rising clock, a first falling clock, first rising data, and first falling data and generate output data, or may receive a second rising clock, a second falling clock, second rising data, and second falling data, generate the output data, and externally output the output data.

DETAILED DESCRIPTION

Hereinafter, a semiconductor device will be described below with reference to the accompanying drawings through various examples of embodiments.

Various embodiments may be directed to the provision of a semiconductor device on which a probe test can be performed by outputting output data through a probe pad when a read operation is performed in test mode.

Figure 1:
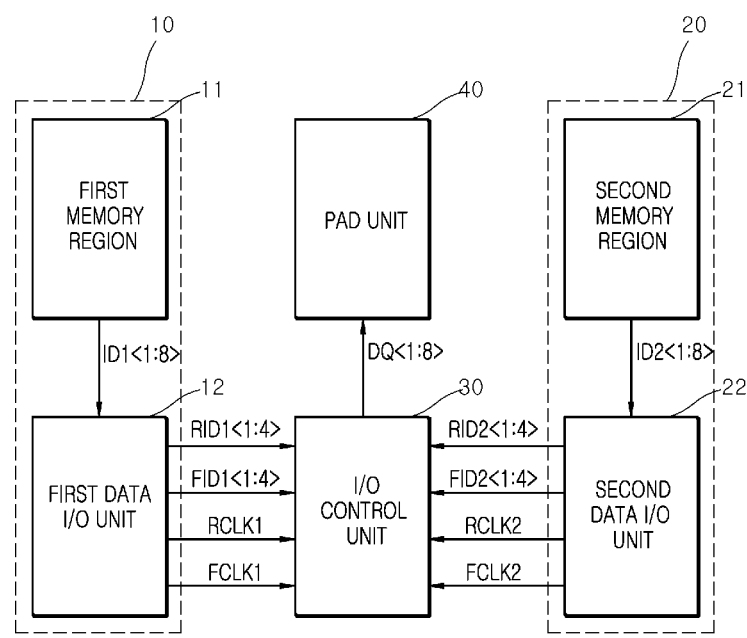
FIG. 1 is a block diagram illustrating a representation of an example of the configuration of a semiconductor device in accordance with an embodiment.

Referring to FIG. 1, the semiconductor device in accordance with an embodiment may include a first channel 10, a second channel 20, and an I/O control unit 30. The semiconductor device may include a pad unit 40.

The first channel 10 may include a first memory region 11 and a first data I/O unit 12.

The first memory region 11 may include a plurality of memory cells and may output first internal data ID1<1:8> when a read operation is performed while the semiconductor device, the first memory region 11, and/or first data I/O unit 12 is operating in a test mode.

The first data I/O unit 12 may extract first rising data RID1<1:4> and first falling data FID1<1:4> from the first internal data ID1<1:8>. In these examples, the first rising data RID1<1:4> may be generated from the odd-numbered internal data ID1<1>, ID1<3>, ID1<5>, and ID1<7> of the first internal data ID1<1:8>. In these examples, the first falling data FID1<1:4> may be generated from the even-numbered internal data ID1<2>, ID1<4>, ID1<6>, and ID1<8> of the first internal data ID1<1:8>. For example, the first rising data RID1<1:4> may be set as data that is input and output in synchronization with the rising edge of a clock in a common semiconductor device. The first falling data FID1<1:4> may be set as data that is input and output in synchronization with the falling edge of a clock in a common semiconductor device.

Figure 2:
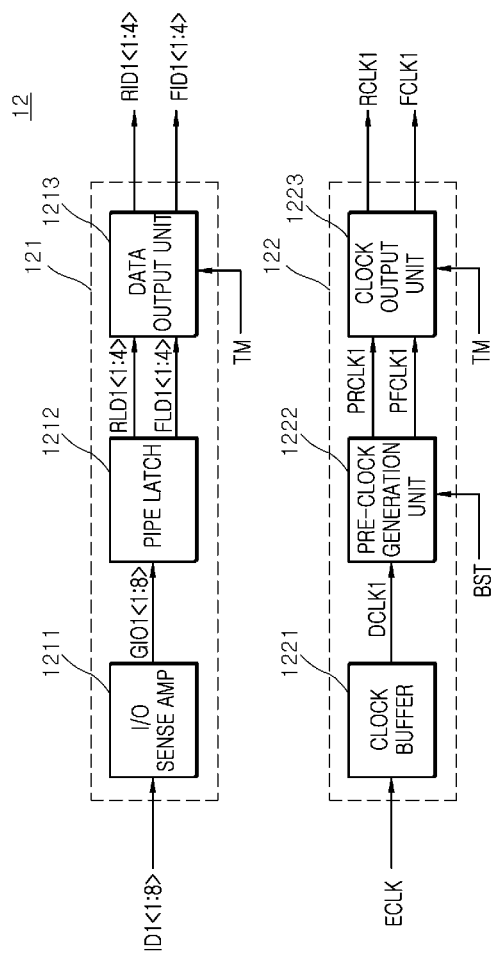
FIG. 2 is a diagram illustrating a representation of an example of the configuration of a first data I/O unit included in the semiconductor device of FIG. 1.

For example, the first data I/O unit 12 may generate a first rising clock RCLK1 and a first falling clock FCLK1 from an external clock ECLK (see FIG. 2). In these examples, the first rising clock RCLK1 may be set as a signal including a pulse generated in synchronization with the rising edge of the external clock ECLK. The first falling clock FCLK1 may be set as a signal including a pulse generated in synchronization with the falling edge of the external clock ECLK.

The second channel 20 may include a second memory region 21 and a second data I/O unit 22.

The second memory region 21 may include a plurality of memory cells and may output second internal data ID2<1:8> when a read operation is performed while the semiconductor device, the second memory region 21, and/or the second data I/O unit 22 is operating in a test mode.

The second data I/O unit 22 may extract second rising data RID2<1:4> and second falling data FID2<1:4> from the second internal data ID2<1:8>. In these examples, the second rising data RID2<1:4> may be generated from the odd-numbered internal data ID2<1>, ID2<3>, ID2<5>, and ID2<7> of the second internal data ID2<1:8>, and the second falling data FID2<1:4> may be generated from the even-numbered internal data ID2<2>, ID2<4>, ID2<6>, and ID2<8> of the second internal data ID2<1:8>. For example, the second rising data RID2<1:4> may be set as data that is input and output in synchronization with the rising edge of a clock in a common semiconductor device. The second falling data FID2<1:4> may be set as data that is input and output in synchronization with the falling edge of a clock in a common semiconductor device.

For example, the second data I/O unit 22 may generate a second rising clock RCLK2 and a second falling clock FCLK2 from the external clock ECLK (see FIG. 2). In these examples, the second rising clock RCLK2 may be set as a signal including a pulse generated in synchronization with the rising edge of the external clock ECLK, and the second falling clock FCLK2 may be set as a signal including a pulse generated in synchronization with the falling edge of the external clock ECLK.

The I/O control unit 30 may be coupled between the first channel 10 and the second channel 20, and may generate output data DQ<1:8> from the first rising data RID1<1:4> and the first falling data FID1<1:4> in synchronization with the first rising clock RCLK1 and the first falling clock FCLK1 or may generate the output data DQ<1:8> from the second rising data RID2<1:4> and the second falling data FID2<1:4> in synchronization with the second rising clock RCLK2 and the second falling clock FCLK2.

The pad unit 40 may include a plurality of pads and may externally output the output data DQ<1:8>. In these examples, the plurality of pads included in the pad unit 40 may be set as probe pads implemented to have sizes for performing probing using the probe pin of test equipment.

Referring to FIG. 2, the first data I/O unit 12 may include a data generation unit 121 and a clock generation unit 122.

The data generation unit 121 may include an I/O sense amplifier (AMP) 1211, a pipe latch 1212, and a data output unit 1213.

The I/O sense AMP 1211 may generate first global data GIO1<1:8> by sensing and amplifying the first internal data ID1<1:8>. In these examples, the I/O sense AMP 1211 may be implemented using a common sense AMP. For example, the first internal data ID1<1:8> may be input in parallel or may be input in series depending on the embodiments.

The pipe latch 1212 may generate first rising latch data RLD1<1:4> by latching the odd-numbered bits GIO1<1>, GIO1<3>, GIO1<5>, and GIO1<7> of the bits of the global data GIO1<1:8>. The pipe latch 1212 may generate first falling latch data FLD1<1:4> by latching the even-numbered bits GIO1<2>, GIO1<4>, GIO1<6>, and GIO1<8> of the bits of the global data GIO1<1:8>.

The data output unit 1213 may buffer the first rising latch data RLD1<1:4> and output the first rising latch data RLD1<1:4> as the first rising data RID1<1:4> when a test mode signal TM is enabled. The data output unit 1213 may buffer the first falling latch data FLD1<1:4> and output the first falling latch data FLD1<1:4> as the first falling data FID1<1:4> when the test mode signal TM is enabled.

For example, the data generation unit 121 may extract the first rising data RID1<1:4> and the first falling data FID1<1:4> from the first internal data ID1<1:8>.

The clock generation unit 122 may include a clock buffer 1221, a pre-clock generation unit 1222, and a clock output unit 1223.

The clock buffer 1221 may buffer the external clock ECLK and generate a first delay clock DCLK1.

The pre-clock generation unit 1222 may generate a first pre-rising clock PRCLK1 having the same phase as the first delay clock DCLK1 for the enable section of a burst signal BST. The pre-clock generation unit 1222 may generate a first pre-falling clock PFCLK1 having a phase opposite the phase of the first delay clock DCLK1 for the enable section of the burst signal BST. In these examples, an enable section may be set in the burst signal BST in order to set the Burst Length (BL), that is, the bits of data consecutively output in a semiconductor device.

When the test mode signal TM is enabled, the clock output unit 1223 may generate the first rising clock RCLK1 including a pulse generated in synchronization with the rising edge of the first pre-rising clock PRCLK1. When the test mode signal TM is enabled, the clock output unit 1223 may generate the first falling clock FCLK1 including a pulse generated in synchronization with the rising edge of the first pre-falling clock PFCLK1.

For example, the clock generation unit 122 may generate the first rising clock RCLK1 including a pulse generated in synchronization with the rising edge of the external clock ECLK for the enable section of the burst signal BST and may generate the first falling clock FCLK1 including a pulse generated in synchronization with the falling edge of the external clock ECLK.

The second data I/O unit 22 is implemented using the same circuit as the first data I/O unit 12 of FIG. 2 and performs substantially the same operation as the first data I/O unit 12 of FIG. 2 except I/O signals, and, thus, a detailed description thereof is omitted.

Figure 3:
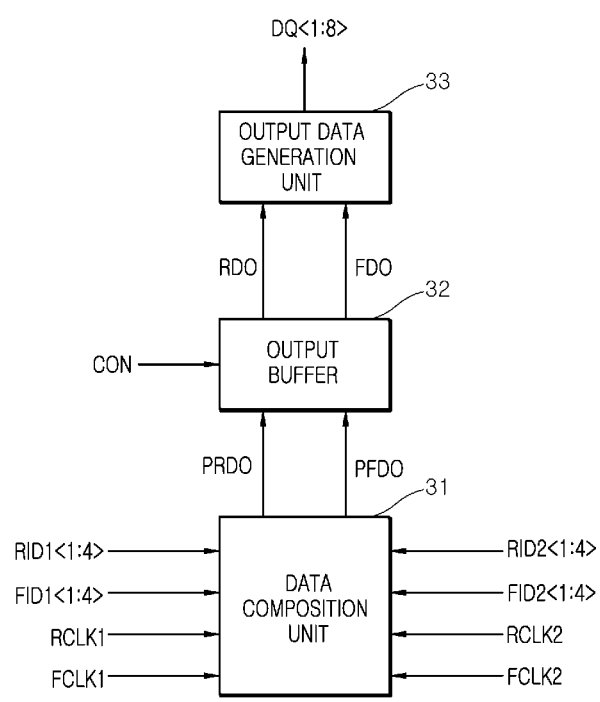
FIG. 3 is a block diagram illustrating a representation of an example of the configuration of an I/O control unit included in the semiconductor device of FIG. 1.

Referring to FIG. 3, the I/O control unit 30 may include a data composition unit 31, an output buffer 32, and an output data generation unit 33.

The data composition unit 31 may buffer the first rising data RID1<1:4> and transfer the buffered first rising data RID1<1:4> as first and second pre-composition data PRDO and PFDO in synchronization with the first rising clock RCLK1. The data composition unit 31 may buffer the first falling data FID1<1:4> and transfer the buffered first falling data FID1<1:4> as the first and second pre-composition data PRDO and PFDO in synchronization with the first falling clock FCLK1. The data composition unit 31 may buffer the second rising data RID2<1:4> and transfer the buffered second rising data RID2<1:4> as the first and the second pre-composition data PRDO and PFDO in synchronization with the second rising clock RCLK2. The data composition unit 31 may buffer the second falling data FID2<1:4> and transfer the buffered second falling data FID2<1:4> as the first and the second pre-composition data PRDO and PFDO in synchronization with the second falling clock FCLK2.

The output buffer 32 may buffer the first pre-composition data PRDO and generate first composition data RDO. The output buffer 32 may buffer the second pre-composition data PFDO and generate second composition data FDO. The output buffer 32 may generate the first composition data RDO and second composition data FDO, the first composition data RDO and second composition data FDO generated when a control signal CON is enabled. In these examples, the control signal CON may be set as a signal that is enabled in an operation in which a semiconductor device does not output data.

The output data generation unit 33 generates output data DQ<1:8> depending on levels of the first composition data RDO and the second composition data FDO.

Figure 4:
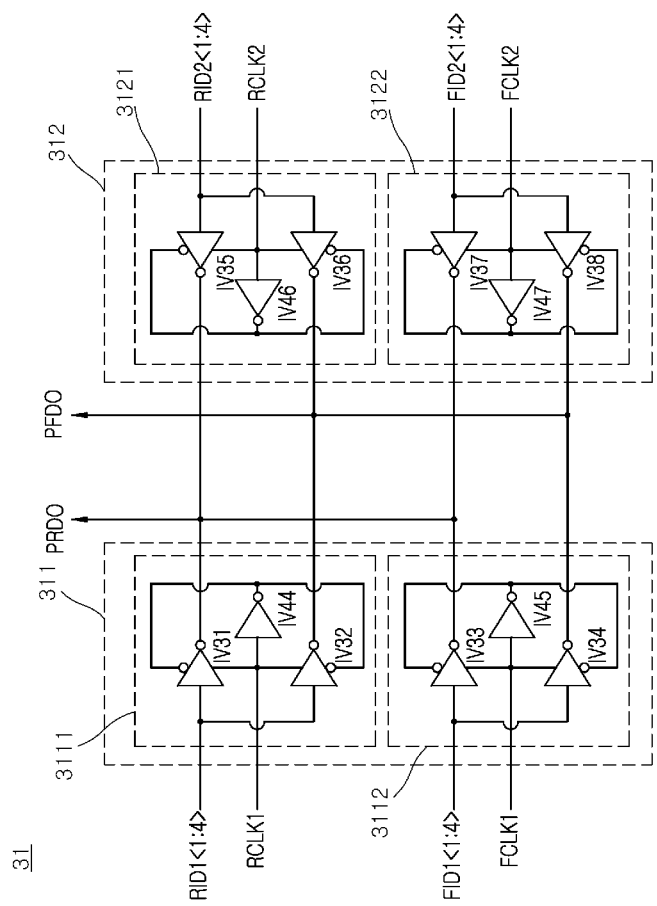
FIG. 4 is a circuit diagram illustrating a representation of an example of the configuration of a data composition unit included in the I/O control unit of FIG. 3.

Referring to FIG. 4, the data composition unit 31 may include a first data composition unit 311 and a second data composition unit 312.

The first data composition unit 311 may include a first transfer unit 3111 and a second transfer unit 3112.

The first transfer unit 3111 may include an inverter IV31 for transferring the first rising data RID1<1:4> as the first pre-composition data PRDO in synchronization with the pulse of the first rising clock RCLK1. The first transfer unit 3111 may include an inverter IV32 for transferring the first rising data RID1<1:4> as the second pre-composition data PFDO in synchronization with the pulse of the first rising clock RCLK1. The first transfer unit 3111 may include an inverter IV44 coupled between the inverters IV31 and IV32 and the inverter IV44 may be configured to receive the first rising clock RCLK1.

The second transfer unit 3112 may include an inverter IV33 for transferring the first falling data FID1<1:4> as the first pre-composition data PRDO in synchronization with the pulse of the first falling clock FCLK1. The second transfer unit 3112 may include an inverter IV34 for transferring the first falling data FID1<1:4> as the second pre-composition data PFDO in synchronization with the pulse of the first falling clock FCLK1. The second transfer unit 3112 may include an inverter IV45 coupled between the inverters IV33 and IV34 and the inverter IV45 may be configured to receive the first falling clock FCLK1.

The first data composition unit 311 may buffer the first rising data RID1<1:4> and output the buffered first rising data RID1<1:4> as the first and the second pre-composition data PRDO and PFDO in synchronization with the pulse of the first rising clock RCLK1. The first data composition unit 311 may buffer the first falling data FID1<1:4> and output the buffered the first falling data FID1<1:4> as the first and the second pre-composition data PRDO and PFDO in synchronization with the pulse of the first falling clock FCLK1.

The second data composition unit 312 may include a third transfer unit 3121 and a fourth transfer unit 3122.

The third transfer unit 3121 may include an inverter IV35 for transferring the second rising data RID2<1:4> as the first pre-composition data PRDO in synchronization with the pulse of the second rising clock RCLK2. The third transfer unit 3121 may include an inverter IV36 for transferring the second rising data RID2<1:4> as the second pre-composition data PFDO in synchronization with the pulse of the second rising clock RCLK2. The third transfer unit 3121 may include an inverter IV46 coupled between the inverters IV35 and IV36 and the inverter IV46 may be configured to receive the second rising clock RCLK2.

The fourth transfer unit 3122 may include an inverter IV37 for transferring the second falling data FID2<1:4> as the first pre-composition data PRDO in synchronization with the pulse of the second falling clock FCLK2. The fourth transfer unit 3122 may include an inverter IV38 for transferring the second falling data FID2<1:4> as the second pre-composition data PFDO in synchronization with the pulse of the second falling clock FCLK2. The fourth transfer unit 3122 may include an inverter IV47 coupled between the inverters IV37 and IV38 and the inverter IV47 may be configured to receive the second falling clock FCLK2.

The second data composition unit 312 may buffer the second rising data RID2<1:4> and output the buffered second rising data RID2<1:4> as the first and the second pre-composition data PRDO and PFDO in synchronization with the pulse of the second rising clock RCLK2. The second data composition unit 312 may buffer the second falling data FID2<1:4> and output the buffered second falling data FID2<1:4> as the first and the second pre-composition data PRDO and PFDO in synchronization with the pulse of the second falling clock FCLK2.

Figure 5:
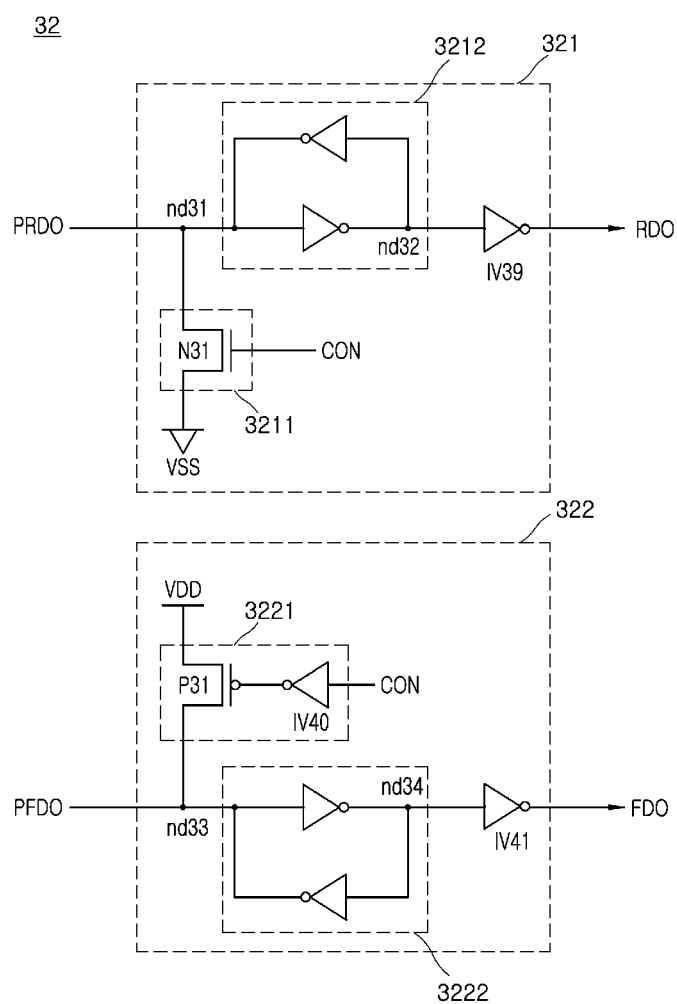
FIG. 5 is a circuit diagram illustrating a representation of an example of the configuration of an output buffer included in the I/O control unit of FIG. 3.

Referring to FIG. 5, the output buffer 32 may include a first buffer unit 321 and a second buffer unit 322.

The first buffer unit 321 may include a first reset unit 3211, a first latch unit 3212, and an inverter IV39.

The first reset unit 3211 may be implemented using an NMOS transistor N31. The NMOS transistor N31 may be coupled between a node nd31 and a ground voltage VSS, and may have a gate configured for receiving the control signal CON. When the control signal CON is enabled to a logic high level, the first reset unit 3211 may pull-down drive the node nd31 to a level of the ground voltage VSS. The node nd31 may be configured for receiving the first pre-composition signal PRDO.

The first latch unit 3212 may be coupled between the node nd31 and a node nd32, and may latch the signal of the node nd31, may invert and buffer the signal of the node nd31, and may output the buffered signal to the node nd32. In these examples, the first latch unit 3212 may be implemented using a common inverter type latch.

The inverter IV39 may invert and buffer the signal of the node nd32 and generate the first composition data RDO. In these examples, the inverter IV39 may be implemented using a repeater for driving a signal from which the first composition data RDO is output.

For example, when the control signal CON is enabled to a logic high level, the first buffer unit 321 may generate the first composition data RDO disabled to a logic low level. When the control signal CON is disabled to a logic low level, the first buffer unit 321 may latch the first pre-composition signal PRDO, may buffer the first pre-composition signal PRDO, and may generate the first composition data RDO.

The second buffer unit 322 may include a second reset unit 3221, a second latch unit 3222, and an inverter IV41.

The second reset unit 3221 may be implemented using an inverter IV40 configured to invert and buffer the control signal CON. The second reset unit 3221 may be implemented using a PMOS transistor P31 coupled between a power source voltage VDD and a node nd33. The gate of the PMOS transistor P31 may be configured receive the output signal of the inverter IV40. When the control signal CON is enabled to a logic high level, the second reset unit 3211 may pull-up drives the node nd33 to a level of the power source voltage VDD. The node nd33 may be configured for receiving the second pre-composition signal PFDO.

The second latch unit 3222 may be coupled between a node nd33 and a node nd34. The second latch unit 3222 may latch the signal of the node nd33. The second latch unit 3222 may invert and buffer the signal of the node nd33. The second latch unit 3222 may output the buffered signal to the node nd34. In these examples, the second latch unit 3222 may be implemented using a common inverter type latch.

The inverter IV41 may invert and buffer the signal of the node nd34 and generate the second composition data FDO. In these examples, the inverter IV41 may be implemented using a repeater for driving a signal line from which the second composition data FDO is output.

For example, when the control signal CON is enabled to a logic high level, the second buffer unit 322 may generate the second composition data FDO disabled to a logic high level. When the control signal CON is disabled to a logic low level, the second buffer unit 322 may latch the second pre-composition signal PFDO, may buffer the second pre-composition signal PFDO, and may generate the second composition data FDO.

Figure 6:
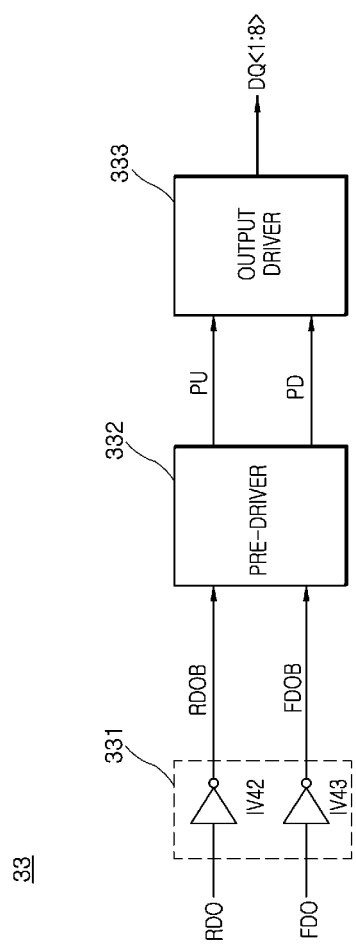
FIG. 6 is a block diagram illustrating a representation of an example of the configuration of an output data generation unit included in the I/O control unit of FIG. 3.

Referring to FIG. 6, the output data generation unit 33 may include a delay unit 331, a pre-driver 332, and an output driver 333.

The delay unit 331 may include an inverter IV42 for inverting and delaying the first composition data RDO and generating the first inversion composition signal RDOB. The delay unit 331 may include an inverter IV43 for inverting and delaying the second composition data FDO and generating the second inversion composition signal FDOB. In these examples, the inverter IV42 may be implemented using a repeater for driving a signal line from which the first inversion composition signal RDOB is output. The inverter IV43 may be implemented using a repeater for driving a signal line from which the second inversion composition signal FDOB is output.

The pre-driver 332 may buffer the first inversion composition data RDOB and generate a pull-up signal PU and may buffer the second inversion composition data FDOB and generate a pull-down signal PD.

The output driver 333 may generate the output data DQ<1:8> depending on levels of the pull-up signal PU and the pull-down signal PD and output the generated data to the pad unit 40 (see FIG. 1).

An operation of the semiconductor device configured as described above in accordance with an embodiment is described below when, for example, a read operation is performed in test mode with reference to FIG. 7. In these examples, a Burst Length (BL) is assumed to be set to 8, and an example of an operation for generating the first rising clock RCLK1 and the first falling clock FCLK1 in response to the external clock ECLK. However, a BL may be set differently according to different embodiments.

First, at a point of time T1, the burst signal BST is enabled to a logic high level.

The pre-clock generation unit 1222 generates the first pre-rising clock PRCLK1 of a logic high level that has the same phase as the external clock ECLK. The pre-clock generation unit 1222 generates the first pre-falling clock PFCLK1 of a logic low level that has a phase opposite the phase of the external clock ECLK.

The clock output unit 1223 generates the first pulse of the first rising clock RCLK1 in synchronization with the first pre-rising clock PRCLK1 of a logic high level.

Next, at a point of time T2, the pre-clock generation unit 1222 generates the first pre-rising clock PRCLK1 of a logic low level that has the same phase as the external clock ECLK. The pre-clock generation unit 1222, at the point of time T2, generates the first pre-falling clock PFCLK1 of a logic high level that has a phase opposite the phase of the external clock ECLK.

The clock output unit 1223 generates the first pulse of the first falling clock FCLK1 in synchronization with the second pre-falling clock PFCLK1 of a logic high level.

Next, at a point of time T3, the pre-clock generation unit 1222 generates the first pre-rising clock PRCLK1 of a logic high level that has the same phase as the external clock ECLK. The pre-clock generation unit 1222, at the point of time T3, generates the first pre-falling clock PFCLK1 of a logic low level that has a phase opposite the phase of the external clock ECLK.

The clock output unit 1223 generates the second pulse of the first rising clock RCLK1 in synchronization with the first pre-rising clock PRCLK1 of a logic high level.

Next, at a point of time T4, the pre-clock generation unit 1222 generates the first pre-rising clock PRCLK1 of a logic low level that has the same phase as the external clock ECLK. The pre-clock generation unit 1222, at the point of time T4, generates the first pre-falling clock PFCLK1 of a logic high level that has a phase opposite the phase of the external clock ECLK.

The clock output unit 1223 generates the second pulse of the first falling clock FCLK1 in synchronization with the second pre-falling clock PFCLK1 of a logic high level.

Next, at a point of time T5, the pre-clock generation unit 1222 generates the first pre-rising clock PRCLK1 of a logic high level that has the same phase as the external clock ECLK. The pre-clock generation unit 1222, at the point of time T5, generates the first pre-falling clock PFCLK1 of a logic low level that has a phase opposite the phase of the external clock ECLK.

The clock output unit 1223 generates the third pulse of the first rising clock RCLK1 in synchronization with the first pre-rising clock PRCLK1 of a logic high level.

Next, at a point of time T6, the pre-clock generation unit 1222 generates the first pre-rising clock PRCLK1 of a logic low level that has the same phase as the external clock ECLK. The pre-clock generation unit 1222, at the point of time T6, generates the first pre-falling clock PFCLK1 of a logic high level that has a phase opposite the phase of the external clock ECLK.

The clock output unit 1223 generates the third pulse of the first falling clock FCLK1 in synchronization with the second pre-falling clock PFCLK1 of a logic high level.

Next, at a point of time T7, the pre-clock generation unit 1222 generates the first pre-rising clock PRCLK1 of a logic high level that has the same phase as the external clock ECLK. The pre-clock generation unit 1222, at the point of time T7, generates the first pre-falling clock PFCLK1 of a logic low level that has a phase opposite the phase of the external clock ECLK.

The clock output unit 1223 generates the fourth pulse of the first rising clock RCLK1 in synchronization with the first pre-rising clock PRCLK1 of a logic high level.

Next, at a point of time T8, since the Burst Length (BL) of the burst signal BST is set to 8, the burst signal BST is disabled to a logic low level after the four cycles (4 tck) of the external clock ECLK from the point of time T1.

The pre-clock generation unit 1222 generates the first pre-rising clock PRCLK1 of a logic low level that has the same phase as the external clock ECLK. The pre-clock generation unit 1222 generates the first pre-falling clock PFCLK1 of a logic high level that has a phase opposite the phase of the external clock ECLK.

The clock output unit 1223 generates the fourth pulse of the first falling clock FCLK1 in synchronization with the second pre-falling clock PFCLK1 of a logic high level.

If, for example, the Burst Length (BL) is set to 8 as described above, the pulse of the first rising clock RCLK1 may be generated four times and the pulse of the first falling clock FCLK1 may be generated four times in response to the external clock ECLK.

Figure 8:
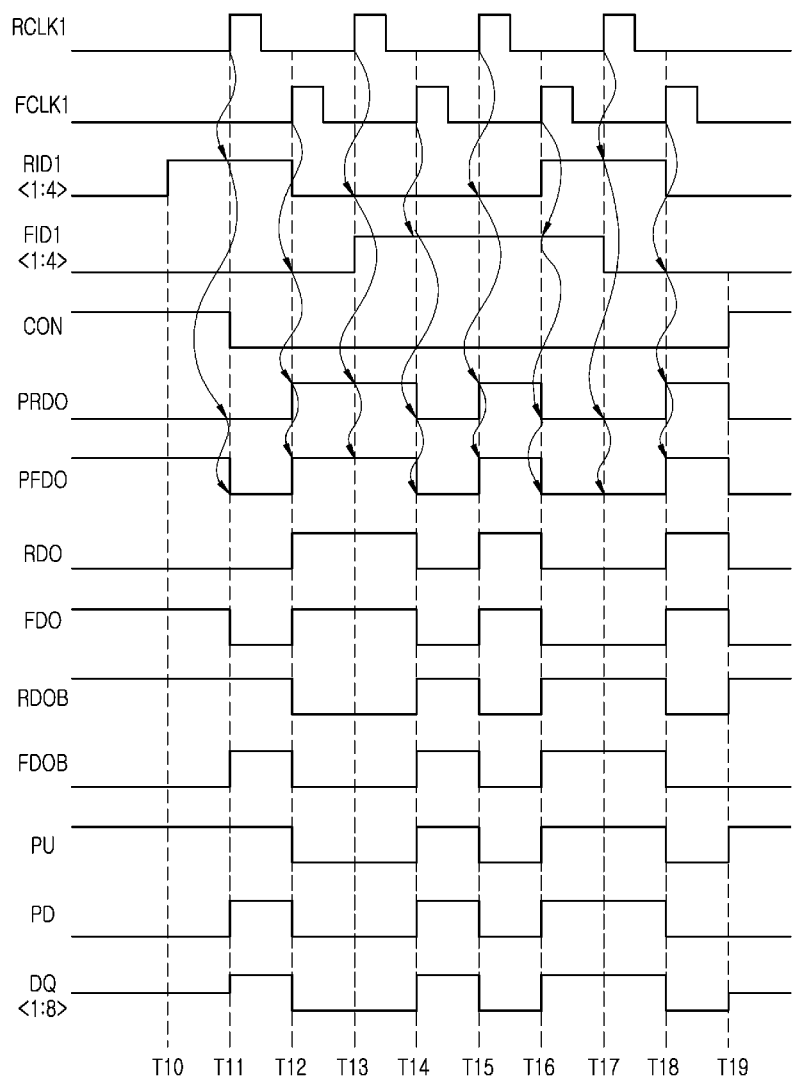

An operation of the semiconductor device configured as described above, for example, in accordance with an embodiment is described below if the Burst Length (BL) is set to 8 and the output data DQ<1:8> is externally output through the probe pad with reference to FIG. 8 when a read operation is performed in test mode. In these examples, the operation of the first channel 10 is described below as an example.

First, if the output data DQ<1:8> is not output prior to the output of data, the control signal CON of a logic high level is received.

The output buffer 32 receives the control signal CON of a logic high level and generates the first composition data RDO of a logic low level and the second composition data FDO of a logic high level.

The output data generation unit 33 receives the first composition data RDO of a logic low level and the second composition data FDO of a logic high level and does not generate the output data DQ<1:8>. In these examples, if the output data DQ<1:8> is not generated, the output data DQ<1:8> may be set as a High-Z state in which them are not driven.

Next, at a point of time T10, the first channel 10 generates the first rising data RID1<1:4> of a logic high level. In these examples, the first rising data RID1<1:4> generated from the point of time T10 to a point of time T12 means the first rising data RID1<1> that is generated as the first bit of the first internal data ID1<1:8> is latched.

Next, at a point of time T11, the first channel 10 generates the first falling data FID1<1:4> of a logic low level. In these examples, the first falling data FID1<1:4> generated from the point of time T11 to a point of time T13 means the first falling data FID1<1> that is generated as the second bit of the first internal data ID1<1:8> is latched.

The first data composition unit 311 of the data composition unit 31 inverts and buffers the first rising data RID1<1:4> in synchronization with the first rising clock RCLK1 of a logic high level. The first data composition unit 311 generates the first pre-composition data PRDO to a logic low level. The first data composition unit 311 generates the second pre-composition data PFDO to a logic low level.

The first buffer unit 321 of the output buffer 32 receives the control signal CON of a logic low level. The first buffer unit 321 buffers the first pre-composition data PRDO. The first buffer unit 321 generates the first composition data RDO of a logic low level.

The second buffer unit 3221 of the output buffer 32 receives the control signal CON of a logic low level. The second buffer unit 3221 buffers the second pre-composition data PFDO. The second buffer unit 3221 generates the second composition data FDO of a logic low level.

The delay unit 331 of the output data generation unit 33 inverts and buffers the first composition data RDO and generates the first inversion composition data RDOB of a logic high level. The delay unit 331 inverts and buffers the second composition data FDO and generates the second inversion composition data FDOB of a logic high level.

The pre-driver 332 of the output data generation unit 33 buffers the first inversion composition data RDOB and generates the pull-up signal PU of a logic high level. The pre-driver 332 buffers the second inversion composition data FDOB and generates the pull-down signal PD of a logic high level.

The output driver 333 of the output data generation unit 33 receives the pull-up signal PU of a logic high level and the pull-down signal PD of a logic high level and generates the output data DQ<1:8> of a logic high level. In these examples, the output data DQ<1:8> of a logic high level that is generated from the point of time T11 to the point of time T12 means the first output data DQ<1> of the output data DQ<1:8> that is consecutively output.

The pad unit 40 externally outputs the first output data DQ<1> through the probe pad.

Figure 7:
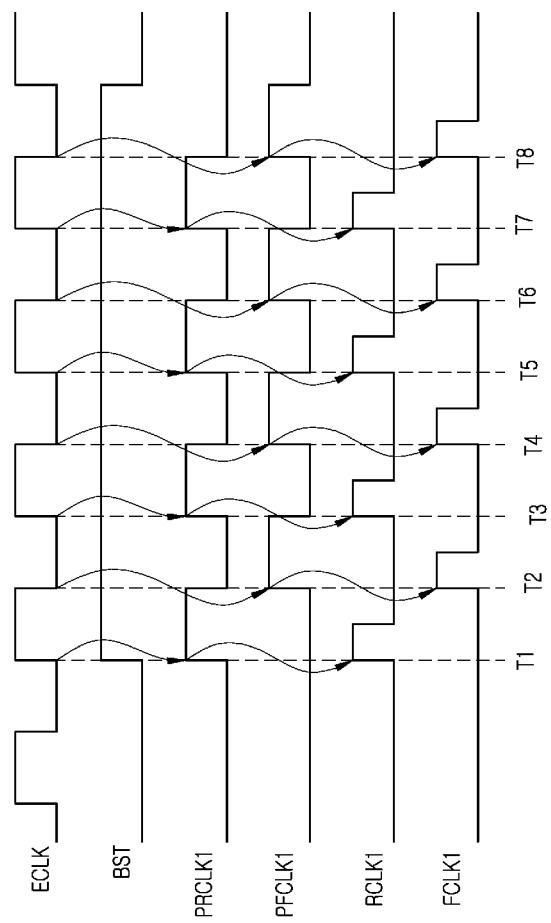
FIGS. 7 and 8 are timing diagrams illustrating a representation of an example of the operation of the semiconductor device of FIG. 1 in accordance with an embodiment.

The point of time T11 is the same point of time as the point of time T1 at which the first pulse of the first rising clock RCLK1 of FIG. 7 is generated.

Next, at the point of time T12, the first channel generates the first rising data RID1<1:4> of a logic low level. In these examples, the first rising data RID1<1:4> generated from the point of time T12 to the point of time T14 means the first rising data RID1<2> that is generated as the third bit of the first internal data ID1<1:8> is latched.

The first data composition unit 311 of the data composition unit 31 inverts and buffers the first falling data FID1<1:4> in synchronization with the first falling clock FCLK1. The first data composition unit 311 generates the first pre-composition data PRDO of a logic high level. The first data composition unit 311 generates the second pre-composition data PFDO of a logic high level.

The first buffer unit 321 of the output buffer 32 receives the control signal CON of a logic low level, buffers the first pre-composition data PRDO, and generates the first composition data RDO of a logic high level.

The second buffer unit 3221 of the output buffer 32 receives the control signal CON of a logic low level, buffers the second pre-composition data PFDO, and generates the second composition data FDO of a logic high level.

The delay unit 331 of the output data generation unit 33 inverts and buffers the first composition data RDO and generates the first inversion composition data RDOB of a logic low level. The delay unit 331 inverts and buffers the second composition data FDO and generates the second inversion composition data FDOB of a logic low level.

The pre-driver 332 of the output data generation unit 33 buffers the first inversion composition data RDOB and generates the pull-up signal PU of a logic low level. The pre-driver 332 buffers the second inversion composition data FDOB and generates the pull-down signal PD of a logic low level.

The output driver 333 of the output data generation unit 33 receives the pull-up signal PU of a logic low level and the pull-down signal PD of a logic low level and generates the output data DQ<1:8> of a logic low level. In these examples, the output data DQ<1:8> of a logic low level that is generated from the point of time T12 to the point of time T13 means the second output data DQ<2> of the output data DQ<1:8> that is consecutively output.

The pad unit 40 externally outputs the second output data DQ<2> through the probe pad.

Meanwhile, the point of time T12 is the same point of time as the point of time T2 at which the first pulse of the first falling clock FCLK1 of FIG. 7 is generated.

Next, at the point of time T13, the first channel generates the first falling data FID1<1:4> of a logic high level. In these examples, the first falling data FID1<1:4> generated from the point of time T13 to a point of time T15 means the first falling data FID1<2> that is generated as the fourth bit of the first internal data ID1<1:8> is latched.

The first data composition unit 311 of the data composition unit 31 inverts and buffers the first rising data RID1<1:4> in synchronization with the first rising clock RCLK1 of a logic high level. The first data composition unit 311 of the data composition unit 31 generates the first pre-composition data PRDO of a logic high level. The first data composition unit 311 of the data composition unit 31 generates the second pre-composition data PFDO of a logic high level.

The first buffer unit 321 of the output buffer 32 receives the control signal CON of a logic low level, buffers the first pre-composition data PRDO, and generates the first composition data RDO of a logic high level.

The second buffer unit 3221 of the output buffer 32 receives the control signal CON of a logic low level, buffers the second pre-composition data PFDO, and generates the second composition data FDO of a logic high level.

The delay unit 331 of the output data generation unit 33 inverts and buffers the first composition data RDO and generates the first inversion composition data RDOB of a logic low level. The delay unit 331 inverts and buffers the second composition data FDO and generates the second inversion composition data FDOB of a logic low level.

The pre-driver 332 of the output data generation unit 33 buffers the first inversion composition data RDOB and generates the pull-up signal PU of a logic low level. The pre-driver 332 buffers the second inversion composition data FDOB and generates the pull-down signal PD of a logic low level.

The output driver 333 of the output data generation unit 33 receives the pull-up signal PU of a logic low level and the pull-down signal PD of a logic low level and generates the output data DQ<1:8> of a logic low level. In these examples, the output data DQ<1:8> of a logic low level that is generated from the point of time T13 to a point of time T14 means the third output data DQ<3> of the output data DQ<1:8> that is consecutively output.

The pad unit 40 externally outputs the third output data DQ<3> through the probe pad.

Meanwhile, the point of time T13 is the same point of time as the point of time T3 at which the second pulse of the first rising clock RCLK1 of FIG. 7 is generated.

Next, at the point of time T14, the first channel generates the first rising data RID1<1:4> of a logic low level. In these examples, the first rising data RID1<1:4> generated from the point of time T14 to the point of time T16 means the first rising data RID1<3> that is generated as the fifth bit of the first internal data ID1<1:8> is latched.

The first data composition unit 311 of the data composition unit 31 inverts and buffers the first falling data FID1<1:4> in synchronization with the first falling clock FCLK1. The first data composition unit 311 of the data composition unit 31 generates the first pre-composition data PRDO of a logic low level. The first data composition unit 311 of the data composition unit 31 generates the second pre-composition data PFDO of a logic low level.

The first buffer unit 321 of the output buffer 32 receives the control signal CON of a logic low level, buffers the first pre-composition data PRDO, and generates the first composition data RDO of a logic low level.

The second buffer unit 3221 of the output buffer 32 receives the control signal CON of a logic low level, buffers the second pre-composition data PFDO, and generates the second composition data FDO of a logic low level.

The delay unit 331 of the output data generation unit 33 inverts and buffers the first composition data RDO and generates the first inversion composition data RDOB of a logic high level. The delay unit 331 inverts and buffers the second composition data FDO and generates the second inversion composition data FDOB of a logic high level.

The pre-driver 332 of the output data generation unit 33 buffers the first inversion composition data RDOB and generates the pull-up signal PU of a logic high level. The pre-driver 332 buffers the second inversion composition data FDOB and generates the pull-down signal PD of a logic high level.

The output driver 333 of the output data generation unit 33 receives the pull-up signal PU of a logic high level and the pull-down signal PD of a logic high level and generates the output data DQ<1:8> of a logic high level. In these examples, the output data DQ<1:8> of a logic high level that is generated from the point of time T14 to the point of time T15 means the fourth output data DQ<4> of the output data DQ<1:8> that is consecutively output.

The pad unit 40 externally outputs the fourth output data DQ<4> through the probe pad.

Meanwhile, the point of time T14 is the same point of time as at the point of time T4 at which the second pulse of the first falling clock FCLK1 of FIG. 7 is generated.

Next, at the point of time T15, the first channel generates the first falling data FID1<1:4> of a logic high level. In these examples, the first falling data FID1<1:4> generated from the point of time T15 to a point of time T17 means the first falling data FID1<3> that is generated as the sixth bit of the first internal data ID1<1:8> is latched.

The first data composition unit 311 of the data composition unit 31 inverts and buffers the first rising data RID1<1:4> in synchronization with the first rising clock RCLK1 of a logic high level. The first data composition unit 311 of the data composition unit 31 generates the first pre-composition data PRDO of a logic high level. The first data composition unit 311 of the data composition unit 31 generates the second pre-composition data PFDO of a logic high level.

The first buffer unit 321 of the output buffer 32 receives the control signal CON of a logic low level, buffers the first pre-composition data PRDO, and generates the first composition data RDO of a logic high level.

The second buffer unit 3221 of the output buffer 32 receives the control signal CON of a logic low level, buffers the second pre-composition data PFDO, and generates the second composition data FDO of a logic high level.

The delay unit 331 of the output data generation unit 33 inverts and buffers the first composition data RDO and generates the first inversion composition data RDOB of a logic low level. The delay unit 331 inverts and buffers the second composition data FDO and generates the second inversion composition data FDOB of a logic low level.

The pre-driver 332 of the output data generation unit 33 buffers the first inversion composition data RDOB and generates the pull-up signal PU of a logic low level. The pre-driver 332 buffers the second inversion composition data FDOB and generates the pull-down signal PD of a logic low level.

The output driver 333 of the output data generation unit 33 receives the pull-up signal PU of a logic low level and the pull-down signal PD of a logic low level and generates the output data DQ<1:8> of a logic low level. In these examples, the output data DQ<1:8> of a logic low level that is generated from the point of time T15 to a point of time T16 means the fifth output data DQ<5> of the output data DQ<1:8> that is consecutively output.

The pad unit 40 externally outputs the fifth output data DQ<5> through the probe pad.

Meanwhile, the point of time T15 is the same point of time as the point of time T5 at which the third pulse of the first rising clock RCLK1 of FIG. 7 is generated.

Next, at the point of time T16, the first channel generates the first rising data RID1<1:4> of a logic high level. In these examples, the first rising data RID1<1:4> generated from the point of time T16 to a point of time T18 means the first rising data RID1<4> that is generated as the seventh bit of the first internal data ID1<1:8> is latched.

The first data composition unit 311 of the data composition unit 31 inverts and buffers the first falling data FID1<1:4> in synchronization with the first falling clock FCLK1. The first data composition unit 311 of the data composition unit 31 generates the first pre-composition data PRDO of a logic low level. The first data composition unit 311 of the data composition unit 31 generates the second pre-composition data PFDO of a logic low level.

The first buffer unit 321 of the output buffer 32 receives the control signal CON of a logic low level, buffers the first pre-composition data PRDO, and generates the first composition data RDO of a logic low level.

The second buffer unit 3221 of the output buffer 32 receives the control signal CON of a logic low level, buffers the second pre-composition data PFDO, and generates the second composition data FDO of a logic low level.

The delay unit 331 of the output data generation unit 33 inverts and buffers the first composition data RDO and generates the first inversion composition data RDOB of a logic high level. The delay unit 331 inverts and buffers the second composition data FDO and generates the second inversion composition data FDOB of a logic high level.

The pre-driver 332 of the output data generation unit 33 buffers the first inversion composition data RDOB and generates the pull-up signal PU of a logic high level. The pre-driver 332 buffers the second inversion composition data FDOB and generates the pull-down signal PD of a logic high level.

The output driver 333 of the output data generation unit 33 receives the pull-up signal PU of a logic high level and the pull-down signal PD of a logic high level and generates the output data DQ<1:8> of a logic high level. In these examples, the output data DQ<1:8> of a logic high level that is generated from the point of time T16 to the point of time T17 means the sixth output data DQ<6> of the output data DQ<1:8> that is consecutively output.

The pad unit 40 externally outputs the sixth output data DQ<6> through the probe pad.

Meanwhile, the point of time T16 is the same point of time as at the point of time T6 at which the third pulse of the first falling clock FCLK1 of FIG. 7 is generated.

Next, at the point of time T17, the first channel generates the first falling data FID1<1:4> of a logic low level. In these examples, the first falling data FID1<1:4> generated from the point of time T17 to the point of time T19 means the first falling data FID1<4> that is generated as the eighth bit of the first internal data ID1<1:8> is latched.

The first data composition unit 311 of the data composition unit 31 inverts and buffers the first pre-composition data PRDO of a logic low level in synchronization with the first rising clock RCLK1 of a logic high level. The first data composition unit 311 of the data composition unit 31 generates the first rising data RID1<1:4>. The first data composition unit 311 of the data composition unit 31 generates the second pre-composition data PFDO of a logic low level.

The first buffer unit 321 of the output buffer 32 receives the control signal CON of a logic low level, buffers the first pre-composition data PRDO, and generates the first composition data RDO of a logic low level.

The second buffer unit 3221 of the output buffer 32 receives the control signal CON of a logic low level, buffers the second pre-composition data PFDO, and generates the second composition data FDO of a logic low level.

The delay unit 331 of the output data generation unit 33 inverts and buffers the first composition data RDO and generates the first inversion composition data RDOB of a logic high level. The delay unit 331 inverts and buffers the second composition data FDO and generates the second inversion composition data FDOB of a logic high level.

The pre-driver 332 of the output data generation unit 33 buffers the first inversion composition data RDOB and generates the pull-up signal PU of a logic high level. The pre-driver 332 buffers the second inversion composition data FDOB and generates the pull-down signal PD of a logic high level.

The output driver 333 of the output data generation unit 33 receives the pull-up signal PU of a logic high level and the pull-down signal PD of a logic high level and generates the output data DQ<1:8> of a logic high level. In these examples, the output data DQ<1:8> of a logic high level that is generated from the point of time T17 to the point of time T18 means the seventh output data DQ<7> of the output data DQ<1:8> that is consecutively output.

The pad unit 40 externally outputs the seventh output data DQ<7> through the probe pad.

Meanwhile, the point of time T17 is the same point of time as the point of time T7 at which the fourth pulse of the first rising clock RCLK1 of FIG. 7 is generated.

Next, at the point of time T18, the first channel 10 does not generate the first rising data RID1<1:4>.

The first data composition unit 311 of the data composition unit 31 inverts and buffers the first falling data FID1<1:4> in synchronization with the first falling clock FCLK1. The first data composition unit 311 of the data composition unit 31 generates the first pre-composition data PRDO of a logic high level. The first data composition unit 311 of the data composition unit 31 generates the second pre-composition data PFDO of a logic high level.

The first buffer unit 321 of the output buffer 32 receives the control signal CON of a logic low level, buffers the first pre-composition data PRDO, and generates the first composition data RDO of a logic high level.

The second buffer unit 3221 of the output buffer 32 receives the control signal CON of a logic low level, buffers the second pre-composition data PFDO, and generates the second composition data FDO of a logic high level.

The delay unit 331 of the output data generation unit 33 inverts and buffers the first composition data RDO and generates the first inversion composition data RDOB of a logic low level. The delay unit 331 inverts and buffers the second composition data FDO and generates the second inversion composition data FDOB of a logic low level.

The pre-driver 332 of the output data generation unit 33 buffers the first inversion composition data RDOB and generates the pull-up signal PU of a logic low level. The pre-driver 332 buffers the second inversion composition data FDOB and generates the pull-down signal PD of a logic low level.

The output driver 333 of the output data generation unit 33 receives the pull-up signal PU of a logic low level and the pull-down signal PD of a logic low level and generates the output data DQ<1:8> of a logic low level. In these examples, the output data DQ<1:8> of a logic low level that is generated from the point of time T18 to a point of time T19 means the eighth output data DQ<8> of the output data DQ<1:8> that is consecutively output.

The pad unit 40 externally outputs the eighth output data DQ<8> through the probe pad.

Meanwhile, the point of time T18 is the same point of time as the point of time T8 at which the fourth pulse of the first falling clock FCLK1 of FIG. 7 is generated.

Next, at the point of time T19, the first channel 10 does not generate the first falling data FID1<1:4>.

In these examples, if the output data DQ<1:8> is not output after the output of data is completed, the control signal CON of a logic high level is received.

The output buffer 32 receives the control signal CON of a logic high level and generates the first composition data RDO of a logic low level and the second composition data FDO of a logic high level.

The output data generation unit 33 receives the first composition data RDO of a logic low level and the second composition data FDO of a logic high level and does not generates the output data DQ<1:8>. In these examples, the case where the output data DQ<1:8> is not generated may be set as a High-Z state in which the output data DQ<1:8> is not driven.

Meanwhile, like the first channel 30, the second channel 40 may perform a read operation through the probe pad in test mode.

A probe test may be performed on the semiconductor device configured as described above in accordance with an embodiment by outputting output data through the probe pad when a read operation is performed in test mode.

In accordance with an embodiment, there may be an advantage in that a probe test can be performed by outputting output data through the probe pad when a read operation is performed in a test mode.

Figure 9:
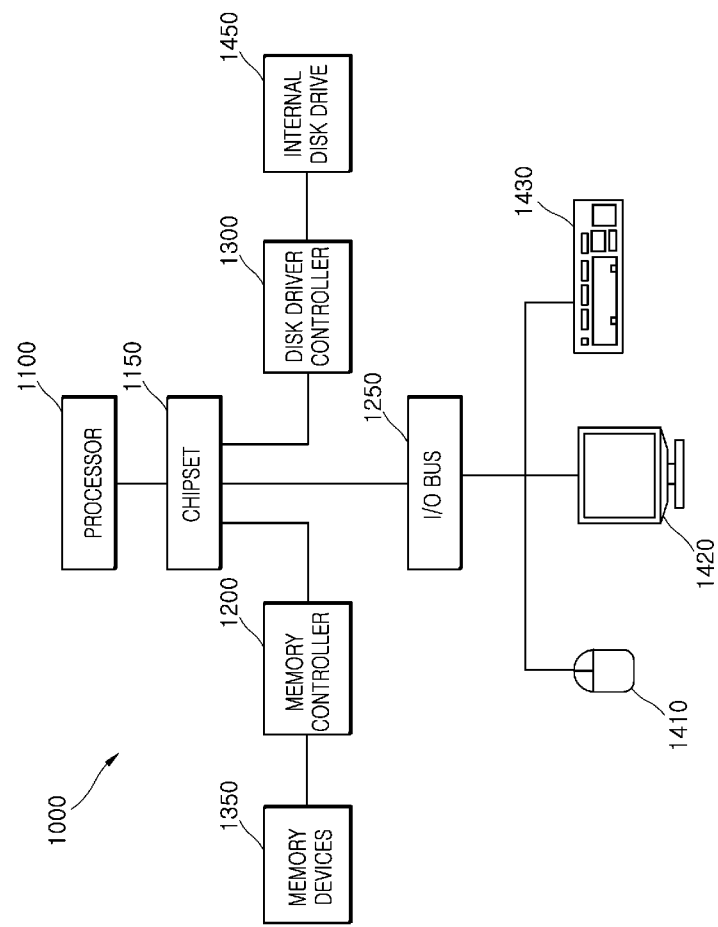
FIG. 9 illustrates a block diagram of an example of a representation of a system employing a semiconductor device in accordance with the various embodiments discussed above with relation to FIGS. 1-8.

The semiconductor device discussed above (see FIGS. 1-8) are particular useful in the design of memory devices, processors, and computer systems. For example, referring to FIG. 9, a block diagram of a system employing the semiconductor device in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor device as discussed above with reference to FIGS. 1-8. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-8, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 9 is merely one example of a system employing the semiconductor device as discussed above with relation to FIGS. 1-8. In alternate embodiments, such as cellular phones or digital cameras, the components may differ from the embodiments illustrated in FIG. 9.

While various embodiments have been described above, it will be understood to those skilled in the art that the embodiments described are by way of example only. Accordingly, the devices described herein should not be limited based on the described embodiments.

What is claimed is:
1. A semiconductor device, comprising:
a first channel configured to output a first rising clock, a first falling clock, first rising data, and first falling data;
a second channel configured to output a second rising clock, a second falling clock, second rising data, and second falling data; and
an I/O control unit configured to receive the first rising clock, the first falling clock, the first rising data, and the first falling data, generate output data, and externally output the output data through a pad unit or receive the second rising clock, the second falling clock, the second rising data, and the second falling data, generate the output data, and externally output the output data through the pad unit.

2. The semiconductor device of claim 1, wherein the first and the second rising clocks are signals generated in synchronization with a rising edge of an external clock.

3. The semiconductor device of claim 1, wherein the first and the second falling clocks are signals generated in synchronization with a falling edge of an external clock.

4. The semiconductor device of claim 1, wherein the first channel comprises:
a first memory region configured to output first internal data while operating in a test mode; and
a first data I/O unit configured to extract the first rising data and the first falling data from the first internal data and generate the first rising clock and the first falling clock from an external clock.

5. The semiconductor device of claim 4, wherein the first data I/O unit comprises:
a first data generation unit configured to latch the first internal data and generate the first rising data and the first falling data by arranging the latched first internal data; and
a first clock generation unit configured to generate the first rising clock and the first falling clock from the external clock for an enable section of a burst signal.

6. The semiconductor device of claim 1, wherein the second channel comprises:
a second memory region configured to output second internal data while operating in a test mode; and
a second data I/O unit configured to extract the second rising data and the second falling data from the second internal data and generate the second rising clock and the second falling clock from an external clock.

7. The semiconductor device of claim 6, wherein the second data I/O unit comprises:
a second data generation unit configured to latch the second internal data and generate the second rising data and the second falling data by arranging the latched second internal data; and
a second clock generation unit configured to generate the second rising clock and the second falling clock from the external clock for an enable section of a burst signal.

8. The semiconductor device of claim 1, wherein the I/O control unit comprises:
a data composition unit configured to generate first and second pre-composition data from the first rising data in synchronization with the first rising clock, generate the first and the second pre-composition data from the first falling data in synchronization with the first falling clock, generate the first and the second pre-composition data from the second rising data in synchronization with the second rising clock, and generate the first and the second pre-composition data from the second falling data in synchronization with the second falling clock;
an output buffer configured to buffer the first pre-composition data and generate first composition data and to buffer the second pre-composition data and generate second composition data in response to a control signal; and
an output data generation unit configured to generate the output data in response to the first and the second composition data and externally output the output data through the pad unit.

9. The semiconductor device of claim 8, wherein the data composition unit comprises:
a first data composition unit configured to buffer the first rising data and output the buffered first rising data as the first and the second pre-composition data in response to a pulse of the first rising clock and to buffer the first falling data and output the buffered first falling data as the first and the second pre-composition data in response to a pulse of the first falling clock; and
a second data composition unit configured to buffer the second rising data and output the buffered second rising data as the first and the second pre-composition data in response to a pulse of the second rising clock and to buffer the second falling data and output the buffered second falling data as the first and the second pre-composition data in response to a pulse of the second falling clock.

10. The semiconductor device of claim 9, wherein the first data composition unit comprises:
a first transfer unit configured to buffer the first rising data and output the buffered first rising data as the first and the second pre-composition data in response to the pulse of the first rising clock; and
a second transfer unit configured to buffer the first falling data and output the buffered first falling data as the first and the second pre-composition data in response to the pulse of the first falling clock.

11. The semiconductor device of claim 9, wherein the second data composition unit comprises:
a third transfer unit configured to buffer the second rising data and output the buffered second rising data as the first and the second pre-composition data in response to the pulse of the second rising clock; and
a fourth transfer unit configured to buffer the second falling data and output the buffered second falling data as the first and the second pre-composition data in response to the pulse of the second falling clock.

12. The semiconductor device of claim 8, wherein the output buffer comprises:
a first node configured to receive the first pre-composition data;
a first buffer unit configured to reset the first node in response to the control signal, latch a signal of the first node, buffer the latched signal of the first node, and generate the first composition data;
a second node configured to receive the second pre-composition data; and
a second buffer unit configured to reset the second node in response to the control signal, latch a signal of the second node, buffer the latched signal of the second node, and generate the second composition data.

13. The semiconductor device of claim 12, wherein:
the first composition data is a signal disabled when the first node is reset, and
the second composition data is a signal disabled when the second node is reset.

14. The semiconductor device of claim 12, wherein:
the first node is coupled between a first latch unit and a first reset unit, the first reset unit including a NMOS transistor coupled between the first node and a ground voltage and the NMOS transistor including a gate configured to receive the control signal; and
the second node coupled between a second latch unit and a second reset unit, the second reset unit including a PMOS transistor coupled between the second node and a power source and the PMOS transistor including a gate configured to receive the control signal through an inverter.

15. The semiconductor device of claim 8, wherein the output data generation unit comprises:

a delay unit configured to buffer the first composition data and generate the first inversion composition data and to buffer the second composition data and generate the second inversion composition data;

a pre-driver configured to buffer the first inversion composition data and generate a pull-up signal and to buffer the second inversion composition data and generate a pull-down signal; and an output driver configured to generate the output data depending on levels of the pull-up signal and the pull-down signal and output the generated output data to the pad unit.

16. A semiconductor device, comprising:

an I/O control unit configured to receive first rising data, first falling data, a first rising clock, and a first falling clock from a first channel and generate output data or receive second rising data, second falling data, a second rising clock, and a second falling clock from a second channel and generate the output data; and a pad unit configured to externally output the output data.

17. The semiconductor device of claim 16, wherein the first and the second rising clocks are signals generated in synchronization with a rising edge of an external clock.

18. The semiconductor device of claim 16, wherein the first and the second falling clocks are signals generated in synchronization with a falling edge of an external clock.

19. The semiconductor device of claim 16, wherein the I/O control unit comprises:

a data composition unit configured to generate first and second pre-composition data from the first rising data in synchronization with the first rising clock, generate the first and the second pre-composition data from the first falling data in synchronization with the first falling clock, generate the first and the second pre-composition data from the second rising data in synchronization with the second rising clock, and generate the first and the second pre-composition data from the second falling data in synchronization with the second falling clock;

an output buffer configured to buffer the first pre-composition data and generate first composition data and to buffer the second pre-composition data and generate second composition data in response to a control signal; and an output data generation unit configured to generate the output data in response to the first and the second composition data and externally output the output data through the pad unit.

20. The semiconductor device of claim 19, wherein the data composition unit comprises:

a first data composition unit configured to buffer the first rising data and output the buffered first rising data as the first and the second pre-composition data in response to a pulse of the first rising clock and to buffer the first falling data and output the buffered first falling data as the first and the second pre-composition data in response to a pulse of the first falling clock; and a second data composition unit configured to buffer the second rising data and output the buffered second rising data as the first and the second pre-composition data in response to a pulse of the second rising clock and to buffer the second falling data and output the buffered second falling data as the first and the second pre-composition data in response to a pulse of the second falling clock.

21. The semiconductor device of claim 20, wherein the first data composition unit comprises:

a first transfer unit configured to buffer the first rising data and output the buffered first rising data as the first and the second pre-composition data in response to the pulse of the first rising clock; and a second transfer unit configured to buffer the first falling data and output the buffered first falling data as the first and the second pre-composition data in response to the pulse of the first falling clock.

22. The semiconductor device of claim 20, wherein the second data composition unit comprises:

a third transfer unit configured to buffer the second rising data and output the buffered second rising data as the first and the second pre-composition data in response to the pulse of the second rising clock; and a fourth transfer unit configured to buffer the second falling data and output the buffered second falling data as the first and the second pre-composition data in response to the pulse of the second falling clock.

23. The semiconductor device of claim 19, wherein the output buffer comprises:

a first node configured to receive the first pre-composition data;

a first buffer unit configured to reset the first node in response to the control signal, latch a signal of the first node, buffer the latched signal of the first node, and generate the first composition data;

a second node configured to receive the second pre-composition data; and a second buffer unit configured to reset the second node in response to the control signal, latch a signal of the second node, buffer the latched signal of the second node, and generate the second composition data.

24. The semiconductor device of claim 23, wherein:

the first composition data is a signal disabled when the first node is reset, and the second composition data is a signal disabled when the second node is reset.

25. The semiconductor device of claim 23, wherein:

the first node is coupled between a first latch unit and a first reset unit, the first reset unit including a NMOS transistor coupled between the first node and a ground voltage and the NMOS transistor including a gate configured to receive the control signal; and the second node coupled between a second latch unit and a second reset unit, the second reset unit including a PMOS transistor coupled between the second node and a power source and the PMOS transistor including a gate configured to receive the control signal through an inverter.

26. The semiconductor device of claim 19, wherein the output data generation unit comprises:

a delay unit configured to buffer the first composition data and generate the first inversion composition data and to buffer the second composition data and generate the second inversion composition data;

a pre-driver configured to buffer the first inversion composition data and generate a pull-up signal and to buffer the second inversion composition data and generate a pull-down signal; and an output driver configured to generate the output data depending on levels of the pull-up signal and the pull-down signal and output the generated output data to the pad unit.

27. A semiconductor device, comprising:

an I/O control unit configured to receive a first rising clock, a first falling clock, first rising data, and first falling data and generate output data or receive a second rising clock, a second falling clock, second rising data, and second falling data, generate the output data, and externally output the output data.

28. The semiconductor device of claim 27, wherein the first and the second rising clocks are signals generated in synchronization with a rising edge of an external clock.

29. The semiconductor device of claim 27, wherein the first and the second falling clocks are signals generated in synchronization with a falling edge of an external clock.

30. The semiconductor device of claim 27, wherein the I/O control unit comprises:
   a data composition unit configured to generate first and second pre-composition data from the first rising data in synchronization with the first rising clock, generate the first and the second pre-composition data from the first falling data in synchronization with the first falling clock, generate the first and the second pre-composition data from the second rising data in synchronization with the second rising clock, and generate the first and the second pre-composition data from the second falling data in synchronization with the second falling clock;
   an output buffer configured to buffer the first pre-composition data and generate first composition data and to buffer the second pre-composition data and generate second composition data in response to a control signal; and
   an output data generation unit configured to generate the output data in response to the first and the second composition data and externally output the output data through a pad unit.

31. The semiconductor device of claim 30, wherein the data composition unit comprises:
   a first data composition unit configured to buffer the first rising data and output the buffered first rising data as the first and the second pre-composition data in response to a pulse of the first rising clock and to buffer the first falling data and output the buffered first falling data as the first and the second pre-composition data in response to a pulse of the first falling clock; and
   a second data composition unit configured to buffer the second rising data and output the buffered second rising data as the first and the second pre-composition data in response to a pulse of the second rising clock and to buffer the second falling data and output the buffered second falling data as the first and the second pre-composition data in response to a pulse of the second falling clock.

32. The semiconductor device of claim 31, wherein the first data composition unit comprises:
   a first transfer unit configured to buffer the first rising data and output the buffered first rising data as the first and the second pre-composition data in response to the pulse of the first rising clock; and
   a second transfer unit configured to buffer the first falling data and output the buffered first falling data as the first and the second pre-composition data in response to the pulse of the first falling clock.

33. The semiconductor device of claim 31, wherein the second data composition unit comprises:
   a third transfer unit configured to buffer the second rising data and output the buffered second rising data as the first and the second pre-composition data in response to the pulse of the second rising clock; and
   a fourth transfer unit configured to buffer the second falling data and output the buffered second falling data as the first and the second pre-composition data in response to the pulse of the second falling clock.

34. The semiconductor device of claim 30, the output buffer comprises:
   a first node configured to receive the first pre-composition data;
   a first buffer unit configured to reset the first node in response to the control signal, latch a signal of the first node, buffer the latched signal of the first node, and generate the first composition data
   a second node configured to receive the second pre-composition data; and
   a second buffer unit configured to reset the second node in response to the control signal, latch a signal of the second node, buffer the latched signal of the second node, and generate the second composition data.

35. The semiconductor device of claim 34, wherein:
   the first composition data is a signal disabled when the first node is reset, and
   the second composition data is a signal disabled when the second node is reset.

36. The semiconductor device of claim 34, wherein:
   the first node is coupled between a first latch unit and a first reset unit, the first reset unit including a NMOS transistor coupled between the first node and a ground voltage and the NMOS transistor including a gate configured to receive the control signal; and
   the second node coupled between a second latch unit and a second reset unit, the second reset unit including a PMOS transistor coupled between the second node and a power source and the PMOS transistor including a gate configured to receive the control signal through an inverter.

37. The semiconductor device of claim 30, wherein the output data generation unit comprises:
   a delay unit configured to buffer the first composition data and generate the first inversion composition data and to buffer the second composition data and generate the second inversion composition data;
   a pre-driver configured to buffer the first inversion composition data and generate a pull-up signal and to buffer the second inversion composition data and generate a pull-down signal; and
   an output driver configured to generate the output data depending on levels of the pull-up signal and the pull-down signal and output the generated output data to the pad unit.

38. The semiconductor device of claim 27, further comprising:
   a first data I/O unit configured to extract the first rising data and the first falling data from a first internal data and generate the first rising clock and the first falling clock from an external clock; and
   a second data I/O unit configured to extract the second rising data and the second falling data from a second internal data and generate the second rising clock and the second falling clock from the external clock.

* * * * *